United States Patent [19]

Roberts

[11] 4,004,235
[45] Jan. 18, 1977

[54] PHASE-LOCKING MIDPULSE DETECTOR

[75] Inventor: James L. Roberts, Seattle, Wash.

[73] Assignee: The United States of America as represented by the Secretary of the Navy, Washington, D.C.

[22] Filed: Mar. 1, 1976

[21] Appl. No.: 662,659

[52] U.S. Cl. .............................. 328/110; 328/133; 331/1 A; 331/25; 329/122

[51] Int. Cl.² ............................................ H03B 3/04

[58] Field of Search ........... 307/232, 233 R, 233 A; 328/133, 134, 140, 155; 331/1 A, 25; 329/122

[56] References Cited

UNITED STATES PATENTS

| | | | |
|---|---|---|---|
| 3,703,686 | 11/1972 | Hekimian | 328/133 X |
| 3,758,870 | 9/1973 | Schmitt et al. | 329/122 X |
| 3,868,579 | 2/1975 | Dilley | 328/110 X |
| 3,956,710 | 5/1976 | Seitz et al. | 331/1 A |

Primary Examiner—John S. Heyman
Attorney, Agent, or Firm—Richard S. Sciascia; Ervin F. Johnston; John Stan

[57] ABSTRACT

Apparatus, in a receiver, for detecting the mid-pulse phase reversal of an input signal $s(t) = a(t)_{BLT} \cos(\omega_c t + \theta)$. The signal $a(t)_{BLT}$ is a modulating signal $a(t)$, having a phase-reversal at its midpoint, after band-limiting by a transmitter, and $\cos(\omega_c t + \theta)$ relates to a carrier having a frequency $f_c$ and arbitrary phase angle $\theta$. The apparatus comprises a hard-limiter and amplifier, a phase-lock loop circuit, a multiplier circuit, a low-pass filter, a comparator, serving the function of a threshold detector, a delay timing logic circuit, and a comparator, serving as a zero crossing detector, whose input is connected to the output of the low-pass filter, which detects the mid-pulse zero-crossing of $a(t)_{BLTR}$ and therefore of $a(t)$. The apparatus further includes an AND gate, whose input comprises a positive-going pulse whose trailing edge represents the mid-pulse of a $(t)_{BLTR}$; and a one-shot, whose output is a sharp pulse representing the mid-pulse of $a(t)$.

1 Claim, 15 Drawing Figures

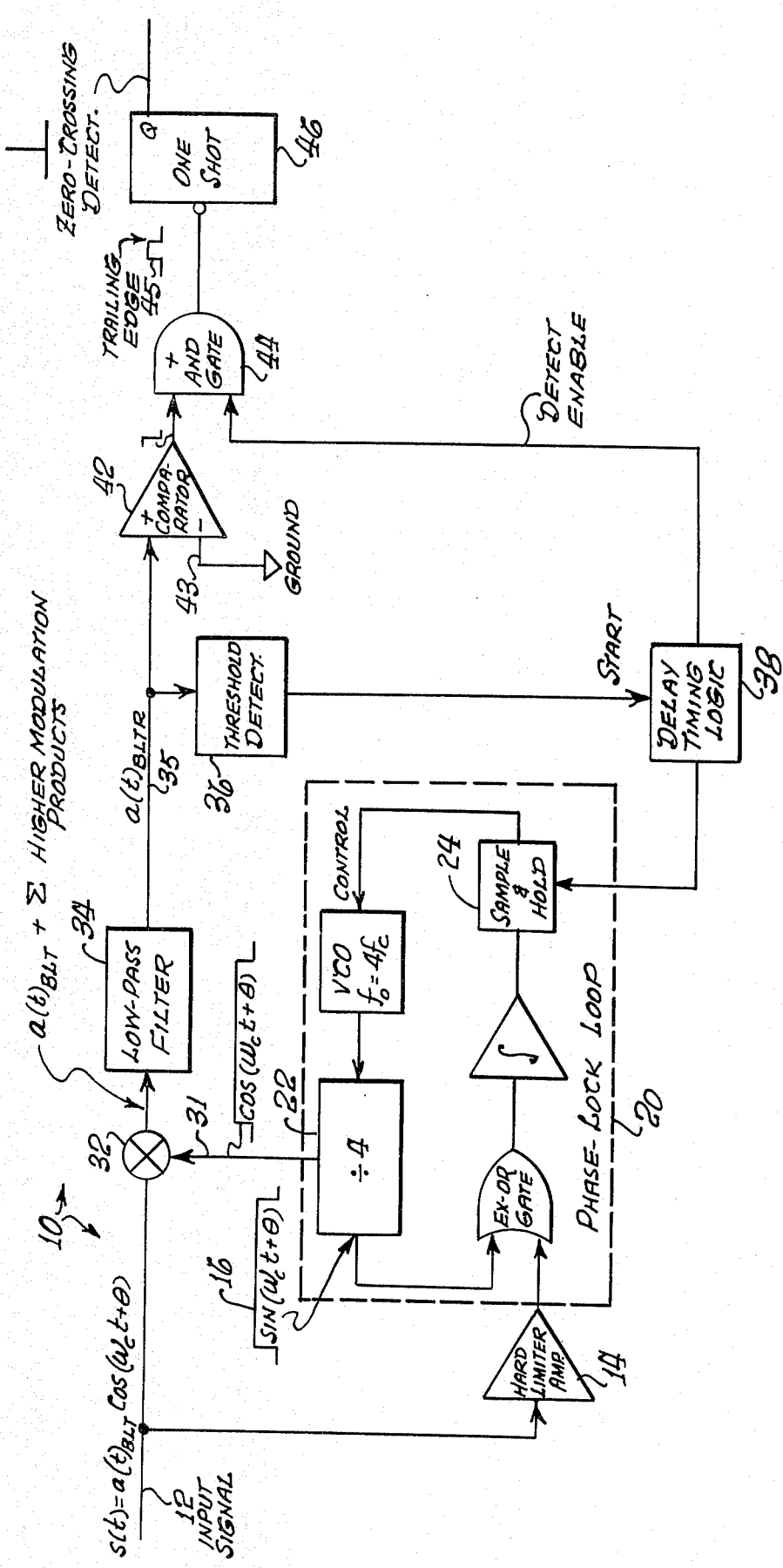
Fig. 1. PHASE-LOCKING MID-PULSE DETECTOR.

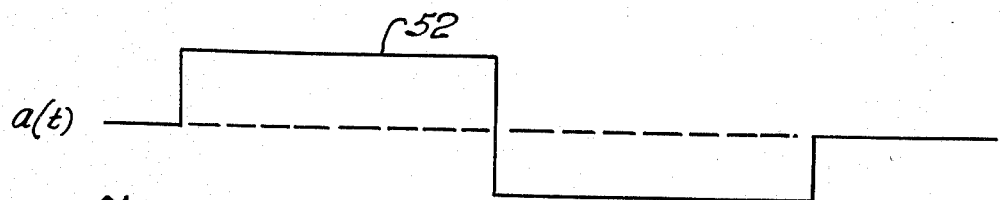
FIG. 2A. MODULATING SIGNAL
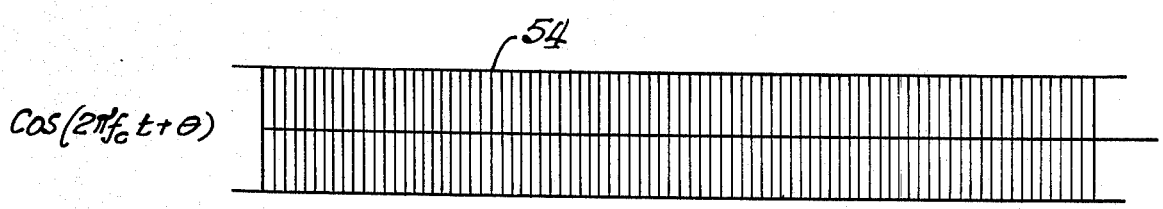
FIG. 2B. CARRIER SIGNAL.
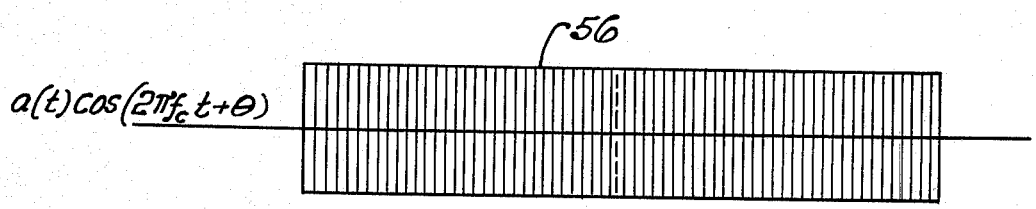
FIG. 2C. THE PRODUCT OF THE MODULATING AND CARRIER SIGNALS.
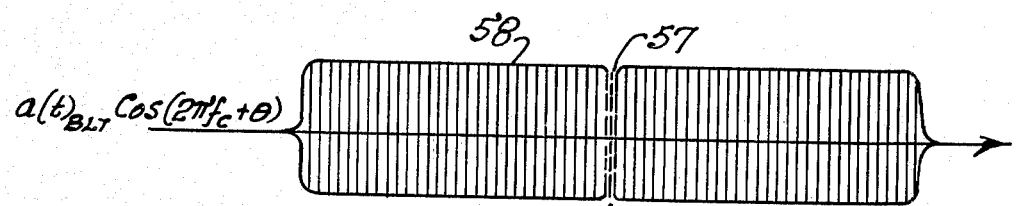
PHASE REVERSAL OF CARRIER.
FIG. 2D. PRODUCT OF THE TWO SIGNALS AFTER BANDLIMITING EFFECTS.
FIG. 2. FORMULATION OF THE TRANSMITTED CARRIER WITH A MID-PULSE PHASE REVERSAL.

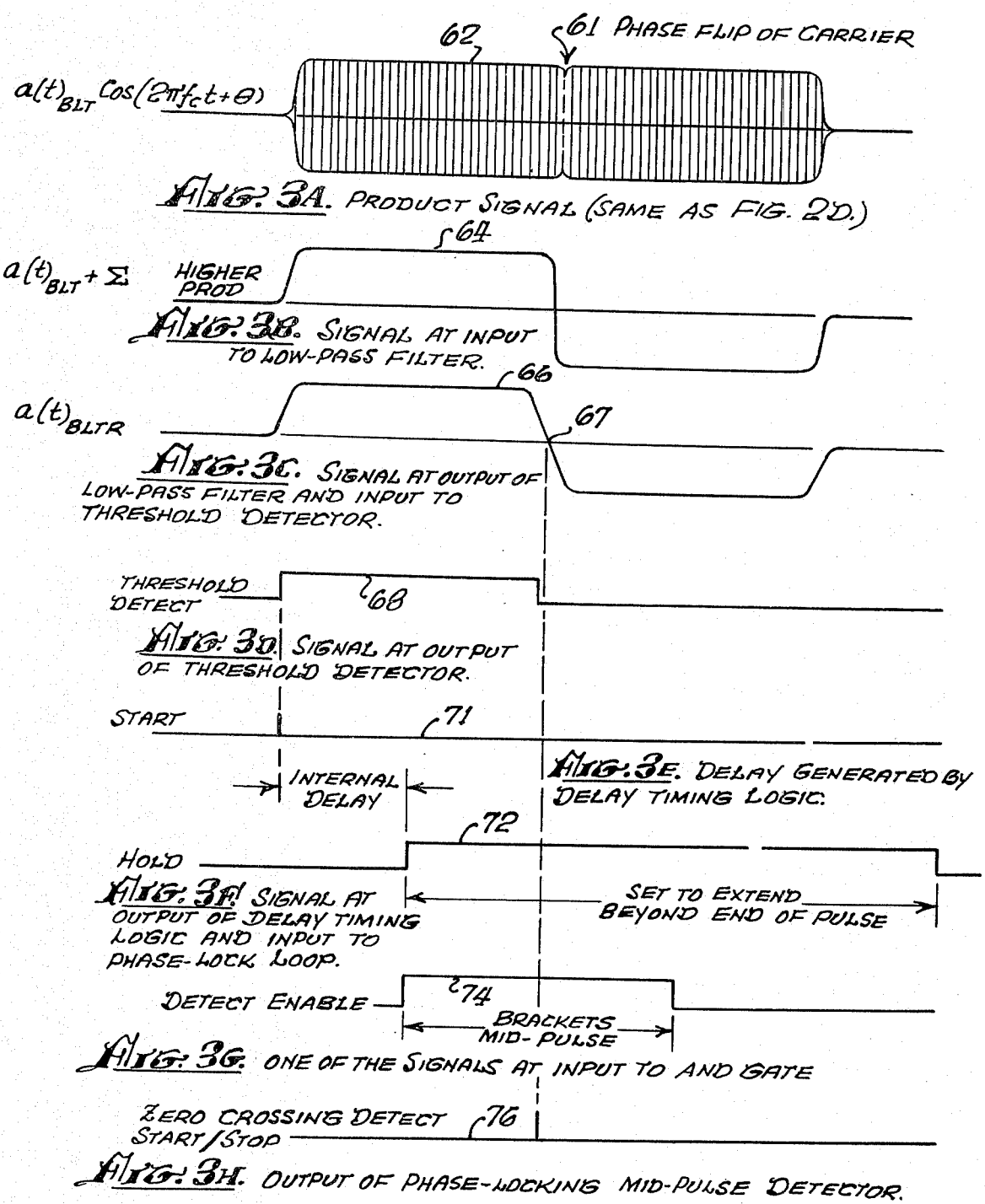
Fig. 3. Waveforms in the receiver for the phase-locking mid-pulse detector.

PHASE-LOCKING MIDPULSE DETECTOR

STATEMENT OF GOVERNMENT INTEREST

The invention described herein may be manufactured and used by or for the Government of the U.S.A. for governmental purposes without the payment of any royalties thereon or therefor.

BACKGROUND OF THE INVENTION

The phase-locking mid-pulse detector may be used in a receiver to detect the exact time of arrival of a pulse.

The phase-locking mid-pulse detector operation is based upon the principle that the instantaneous phase reversal of a carrier frequency can be readily detected as a zero-crossing of the amplitude modulation function, or waveform. In more detail, let $a(t)$ represent the desired modulation function and let $\cos(2\pi f_c t + \theta)$ represent the carrier, where $\theta$ is merely an arbitrary phase factor. The modulated carrier, $a(t) \cos(2\pi f_c t + \theta)$, is the product of the two. The finite bandwidth of the signal generator, transmitting system, and the transmission path, introduces finite rise and fall time effects.

In the prior art, leading edge detection has been used to determine pulse arrival time. This method is subject to biased errors which are a function of signal level relative to detection threshold. The mid-pulse detector of this invention detects a zero-crossing of the modulation function and eliminates this sensitivity to signal amplitude.

Another prior art method of mid-pulse detection is the pulse-differentiation technique. The pulse is first heavily filtered so as to produce a rounded pulse envelope. The differentiation process then produces a zero crossing at the peak of the pulse. This method is sensitive to pulse envelope distortions, which cause the pulse peak to shift relative to the true mid-pulse. Here again, the phase-locking mid-pulse detector has the advantages of being insensitive to pulse-envelope modulation.

SUMMARY OF THE INVENTION

This invention relates to an apparatus, in a receiver, for detecting the mid-pulse phase reversal of an input signal $s(t) = a(t)_{BLT} \cos(\omega_c t + \theta)$. The signal $a(t)_{BLT}$ is a modulating signal $a(t)$ after band-limiting by a transmitter, and $\cos(\omega_c t + \theta)$ relates to a carrier having a frequency $f_c$ and arbitrary phase angle $\theta$.

A hard-limiting amplifier has its input connected to the input signal $s(t)$.

A phase-lock loop circuit, connected to, and one of whose inputs is, the output of the hard limiter, has as its output the signal $\cos(\omega_c t + \theta)$ hard limited, at 31.

A multiplier circuit has as its two inputs the input signal $s(t)$ and the output of the phase-lock loop. The output of the multiplier comprises the signal $a(t)_{BLT}$ plus the sum of higher modulation products.

A low-pass filter, whose input is connected to the output of the multiplier, has as its output $a(t)_{BLTR}$, which is the signal $a(t)$ as modified by the band limiting effects of the transmitter and receiver. The higher modulation products are filtered out by the low-pass filter.

A threshold detector, serving the function of a comparator, whose input is connected to the output of the low-pass filter, senses the presence of a received pulse.

A delay timing logic circuit, whose input is connected to the output of the threshold detector, and one of whose outputs is connected, and forms the second input, to the phase-lock loop, delays its output signal to the phase-lock loop circuit.

A zero crossing detector, whose input is connected to the output of the low-pass filter, detects the mid-pulse zero crossing of $a(t)_{BLTR}$ and therefore of $a(t)$.

An AND gate, whose inputs are connected to the outputs of the zero crossing detector and of the delay timing logic circuit, has an output which comprises a positive-going pulse whose trailing edge represents the mid-pulse of $a(t)_{BLTR}$.

A one-shot, whose input is connected to the output of the AND gate, has as its output a sharp pulse representing the mid-pulse of $a(t)$.

STATEMENT OF THE OBJECTS OF THE INVENTION

An object of the invention is to provide a phase-locking mid-pulse detector which is insensitive to signal amplitude.

Another object of the invention is to provide a phase-locking mid-pulse detector which is also insensitive to pulse envelope modulation.

Other objects, advantages, and novel features of the invention will become apparent with the following detailed description of the invention, when considered in conjunction with the accompanying drawings.

BRIEF DESCRIPTION OF THE DRAWINGS

FIG. 1 is a block diagram of the phase-locking mid-pulse detector of this invention.

FIGS. 2A–2D are a set of four waves which show how the transmitted carrier with a mid-pulse phase reversal is formulated.

FIGS. 3A–3H are a set of wave forms in the receiver of the phase locking mid pulse detector.

DESCRIPTION OF THE PREFERRED EMBODIMENT

Referring now to FIG. 1, this figure shows an apparatus, 10, used generally in a receiver, for detecting the mid-pulse reversal of an input signal 12, $s(t) = a(t)_{BLT} \cos(\omega_c + \theta)$, shown in FIG. 2C. The signal $a(t)_{BLT}$ is a modulating signal $a(t)$ after band-limiting (BL) by a transmitter $(t)$, and $\cos(\omega_c t + \theta)$ relates to a carrier having a frequency $f_c$ and arbitrary phase angle $\theta$.

A hard-limiting amplifier 14 has its input connected to the input signal $s(t)$ at 12.

A phase-lock loop circuit 20, one of whose two inputs is the output of the hard limiter 14, has as its output the hard limited signal $\cos(\omega_c t + \theta)$, shown diagrammatically at lead 31.

The phase-lock loop circuit 20 is a conventional circuit, except for the inclusion of blocks 22 and 24, which does not form a substantial difference.

A multiplier circuit 32 has as its two inputs the input signal $s(t)$ at 12 and the output signal 31 of the phase-lock loop 20. The output of the multiplier 32 comprises the signal $a(t)_{BLT}$ plus the sum of higher modulation products.

A low-pass filter 34 has as its input the output of the multiplier 32. Its output is $a(t)_{BLTR}$, shown in FIG. 3C, which is the signal $a(t)$, shown in FIG. 2A, as modified by the band limiting effects of the transmitter and receiver. The higher modulation products are filtered out by filter 34.

A threshold detector 36, whose input is connected to the output of the low-pass filter 34, senses the presence of a received pulse.

A delay timing logic circuit 38, whose input is connected to the output of the threshold detector 36, has one of its outputs connected to an input of the phase-lock loop 20. Its purpose is to delay the leading edge of signal $a(t)_{BLTR}$ before it starts the hold command, FIG. 3F, which enters the phase-lock loop circuit 20. A comparator 42, having the function of a zero crossing detector, whose input is connected to the output of the low-pass filter 34, detects the mid-pulse zero crossing of the waveform $a(t)_{BLTR}$, and therefore of the signal $a(t)$, shown in FIGS. 3C and 2A, respectively. The comparator 42 is a zero-crossing detector which compares the voltage of the incoming signal $a(t)_{BLTR}$, shown in FIG. 3C, with ground voltage at lead 43, in FIG. 1.

An AND gate 44, whose inputs are connected to the outputs of the comparator 42 and of the delay timing logic circuit 38, has an output which comprises a positive-going pulse 45 whose trailing edge represents the mid-pulse of $a(t)_{BLTR}$.

A one-shot 46, whose input is connected to the output of the AND gate 44, has an output in the form of a sharp pulse representing the mid-pulse of $a(t)$. As is shown in FIG. 1, the one shot 46 triggers on the trailing edge of the input signal 45.

Discussing now in more detail the theoretical background of the invention, FIG. 1 is a functional diagram of the apparatus 10 for detecting the mid-pulse phase reversal of the received signal. the input signal, $s(t)$, is $$s(t) = a(t)_{BLT} \cos(2\pi f_c t + \theta), \qquad 1.$$

where $$a(t)_{BLT} = a(t) \text{ modified by} \qquad 2.$$

the band-limiting effects described hereinabove.

Referring now to FIG. 2A, the modulating function $a(t)$ shown therein need not be restricted to the symmetrical waveform shown therein. It may have other symmetrical shapes or even unsymmetrical shapes, the only requirement being that there be a zero crossing, preferably with a 90° slope, at the midpoint of the waveform. It could even be an undulating waveform, as long as there is a sharply defined crossover at the midpoint. The waveform similar to one shown in FIG. 2A was one actually used.

A waveform not sharply defined at the cross-over point could be sensitive to noise. The signal could be a continuous signal which is phase modulated, so long as there is a phase reversal at the midpoint.

The carrier frequency $f_c$ has two zero crossings per cycle, since the phase of the carrier wave is continuous, but only one phase reversal $a(t)$ (FIG. 2A), as is shown at 57 of FIG. 2D and 61 of FIG. 3A. In a phase reversal as the sine wave, represented by the carrier, decreases to a magnitude of zero at 180°, instead of assuming increasingly negative values beyond 180°, the wave does not cross the zero magnitude line, but instead assumes increasingly positive values.

Referring back to FIG. 1, the phase-lock loop circuit 20 tries to track the phase of the signal, the carrier $f_c$ in this case. Therefore, if the phase of the signal changes, the phase-lock loop 20 attempts to change in a manner so that it still tracks the signal. The phase-lock mid-pulse phase detector 10 of this invention locks on to and follows the phase of the carrier frequency in the pulse until the middle of the pulse, 67 in FIG. 3C arrives.

If it tries to follow it through the zero crossing, the phase-lock loop 20 will attempt to flip its phase too. This is not desirable because the zero crossing, 67 in FIG. 3C, of the modulation function $a(t)$ is detected by holding the phase of the phase lock loop 20 which existed at the beginning of the pulse through into the second part of the pulse. Essentially what happens is that the phase-lock loop 20 cross-correlates with the incoming signal $a(t)$. When this phase flip occurs, the cross-correlation sees a reversal of the phase right at the phase flip.

Upon sensing the presence of an input signal, from hard limiting amplifier 14, the phase-lock loop 20 generates a hardlimited form of $\cos(2\pi f_c t + \theta)$ at output 31 which is multiplied, in the multiplier 32, by signal $s(t)$ to recover the signal $a(t)_{BLT}$ plus high modulation products, at the output of the multiplier. Subsequent low-pass filtering forms $a(t)_{BLTR}$, at 35 in FIG. 1 and in FIG. 3C, which is $a(t)$ now modified by the bandlimiting effects of both the transmit and receive system.

The timing signals in FIG. 3 shows how the threshold detector 36 senses the presence of a received pulse and, after sufficient delay to allow for stabilization of the phase-lock loop 20, creates a hold of the voltage-controlled oscillator (VCO) frequency control for the remainder of the pulse. This allows the comparator 42 to observe the zero-crossing of $a(t)$, FIG. 2A, which would otherwise be removed by the phase-tracking action of the phase-lock loop 20. The signal "Detect Enable", 74 in FIG. 3G, at the input to AND gate 44, brackets the zero-crossing period, as shown, and is used as an output enabling signal to reduce the probability of a spurious detection.

Obviously, many modifications and variations of the present invention are possible in the light of the above teachings, and it is therefore to be understood that, within the scope of the appended claims, the invention may be practiced otherwise than as specifically described.

What is claimed is:
1. Apparatus, in a receiver, for detecting the mid-pulse phase reversal of an input signal $s(t) = a(t)_{BLT} \cos(\omega_c t + \theta)$, where the signal $a(t)_{BLT}$ is a modulating signal $a(t)$ after band-limiting by a transmitter and $\cos(\omega_c t + \theta)$ relates to a carrier having a frequency $f_c$ and arbitrary phase angle $\theta$, comprising:
   a hard-limiter and amplifier whose input is connected to the input signal $s(t)$;
   a phase-lock loop circuit, connected to and one of whose two inputs is the output of the hard limiter, and whose output is the signal $\cos(\omega_c t + \theta)$ hard limited;
   a multiplier circuit, whose two inputs are connected to the input signal $s(t)$ and the output of the phase-lock loop, the output of the multiplier comprising the signal $a(t)_{BLT}$ plus the sum of higher modulation products,
   a low-pass filter, whose input is connected to the output of the multiplier and whose output is $a(t)_{BLTR}$, which is the signal $a(t)$ as modified by the band limiting effects of the transmitter and receiver, the higher modulation products being filtered out by the low-pass filter;
   a comparator, serving the function of a threshold detector, whose input is connected to the output of the low-pass filter, which senses the presence of a received pulse;

a delay timing logic circuit, whose input is connected to the output of the threshold detector, and one of whose outputs is connected, and forms the second input, to the phase-lock loop for delaying its output signal to the phase-lock loop circuit;

a zero crossing detector, whose input is connected to the output of the low-pass filter, which detects the mid-pulse zero crossing of a $a(t)_{BLTR}$, and therefore of $a(t)$;

an AND gate, whose inputs are connected to the outputs of the zero crossing detector and of the delay timing logic circuit, and whose output comprises a positive-going pulse whose trailing edge represents the mid-pulse of $a(t)_{BLTR}$; and a one-shot, whose input is connected to the output of the AND gate, and whose output is a sharp pulse representing the mid-pulse of $a(t)$.

* * * * *